United States Patent [19]
Intrater et al.

[11] Patent Number: 6,064,094
[45] Date of Patent: May 16, 2000

[54] OVER-VOLTAGE PROTECTION SYSTEM FOR INTEGRATED CIRCUITS USING THE BONDING PADS AND PASSIVATION LAYER

[75] Inventors: James Intrater, Santa Clara; Kailash Joshi, Milpitas, both of Calif.

[73] Assignee: Oryx Technology Corporation, Fremont, Calif.

[21] Appl. No.: 09/037,763

[22] Filed: Mar. 10, 1998

[51] Int. Cl.$^7$ ............................................. H01L 29/72
[52] U.S. Cl. .................. 257/355; 257/489; 257/536; 257/632; 257/642; 257/650; 257/750
[58] Field of Search .................................. 257/355, 489, 257/536, 632, 642, 650, 750

[56] References Cited

U.S. PATENT DOCUMENTS

| | | |
|---|---|---|
| 3,676,742 | 7/1972 | Russell et al. . |
| 3,813,639 | 5/1974 | Schurter et al. . |
| 4,331,948 | 5/1982 | Malinaric et al. . |
| 4,436,183 | 3/1984 | Davis et al. . |
| 4,486,738 | 12/1984 | Sadlo et al. . |
| 4,586,105 | 4/1986 | Lippmann et al. . |
| 4,726,991 | 2/1988 | Hyatt et al. . |
| 4,729,752 | 3/1988 | Dawson, Jr. et al. . |
| 4,770,738 | 9/1988 | Robillard . |
| 4,788,523 | 11/1988 | Robbins . |
| 4,813,891 | 3/1989 | Walters et al. . |
| 4,819,047 | 4/1989 | Gilfeather et al. . |
| 4,928,199 | 5/1990 | Diaz et al. ............................ 257/355 |
| 4,939,619 | 7/1990 | Borkowicz et al. . |
| 4,945,395 | 7/1990 | Suehiro . |
| 4,977,357 | 12/1990 | Shrier . |
| 4,992,333 | 2/1991 | Hyatt . |
| 5,008,770 | 4/1991 | Hilland . |
| 5,029,041 | 7/1991 | Robinson et al. . |
| 5,068,634 | 11/1991 | Shrier . |
| 5,089,929 | 2/1992 | Hilland . |
| 5,099,380 | 3/1992 | Childers et al. . |
| 5,101,317 | 3/1992 | Cwirzen et al. . |
| 5,130,881 | 7/1992 | Hilland . |
| 5,142,263 | 8/1992 | Childers et al. . |
| 5,175,662 | 12/1992 | DeBalko et al. . |
| 5,183,698 | 2/1993 | Stephenson et al. ................... 257/355 |
| 5,189,387 | 2/1993 | Childers et al. . |
| 5,194,010 | 3/1993 | Dambach et al. . |
| 5,195,010 | 3/1993 | Dresner . |
| 5,197,891 | 3/1993 | Tanigawa et al. . |
| 5,208,723 | 5/1993 | Jenne . |
| 5,216,404 | 6/1993 | Nagai et al. . |
| 5,229,037 | 7/1993 | Nakano et al. . |
| 5,246,388 | 9/1993 | Collins et al. . |
| 5,248,517 | 9/1993 | Shrier et al. . |
| 5,260,848 | 11/1993 | Childers . |
| 5,262,754 | 11/1993 | Collins . |
| 5,278,535 | 1/1994 | Xu et al. . |
| 5,294,374 | 3/1994 | Martinez et al. . |
| 5,301,084 | 4/1994 | Miller . |
| 5,315,472 | 5/1994 | Fong et al. . |
| 5,340,641 | 8/1994 | Xu . |
| 5,342,220 | 8/1994 | Kodama . |
| 5,393,597 | 2/1995 | Childers et al. . |
| 5,416,662 | 5/1995 | Kurasawa et al. . |
| 5,444,593 | 8/1995 | Allina . |
| 5,483,407 | 1/1996 | Anastasio et al. . |
| 5,515,226 | 5/1996 | Tailliet . |
| 5,578,867 | 11/1996 | Argos, Jr. et al. . |
| 5,674,083 | 10/1997 | Whiteman, Jr. et al. . |
| 5,715,127 | 2/1998 | Yu . |
| 5,796,570 | 8/1998 | Mekdhanasarn et al. . |

FOREIGN PATENT DOCUMENTS

| | | |
|---|---|---|
| 405036341 | 2/1993 | Japan . |
| WO 96/02922 | 2/1996 | WIPO . |

OTHER PUBLICATIONS

Technological Advances: Novel Cost Effective Surge Arresting Material and Devices for Protecting Integrated Circuits against Electrostatic Discharge, Materials Technology, vol. 9, No. 3/4, Feb./Mar. 1994.

*Primary Examiner*—Edward Wojciechowicz
*Attorney, Agent, or Firm*—Burns Doane Swecker & Mathis LLP

[57] ABSTRACT

A protection system for integrated circuits which prevents inadvertent damage caused by over-voltage power surges by extending the passivation layer of an integrated circuit over the bonding pads and placing a ground plane over that passivation layer so as to create an over-voltage switching element out of that combination.

14 Claims, 2 Drawing Sheets

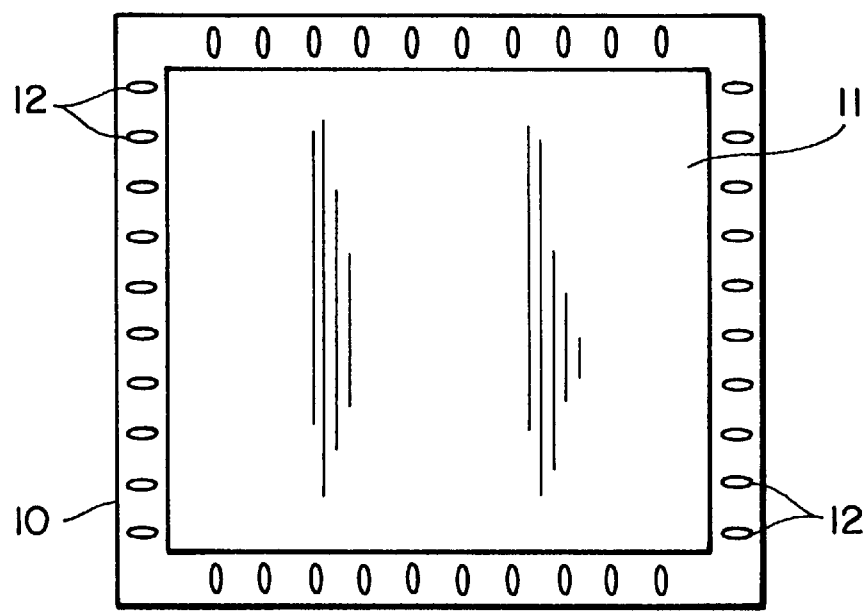
FIG_1
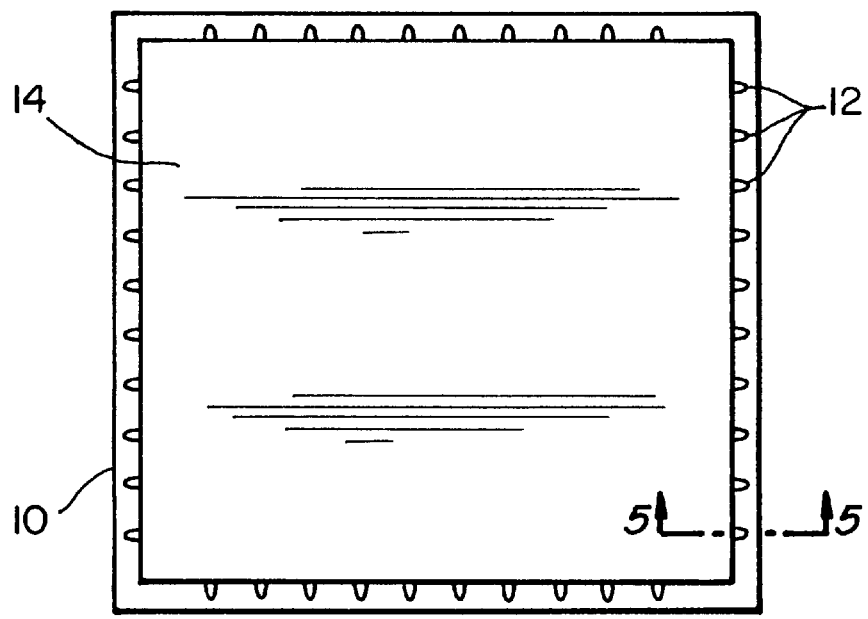
FIG_2

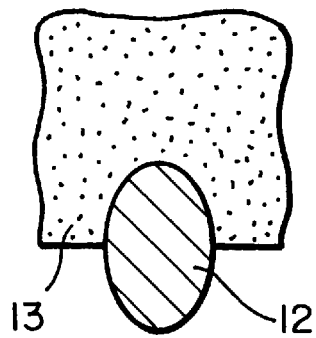
FIG_3
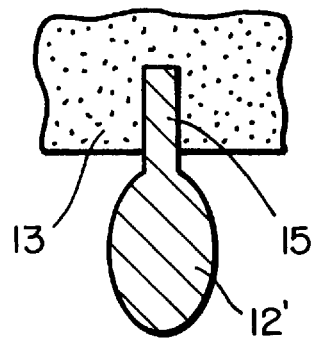
FIG_4
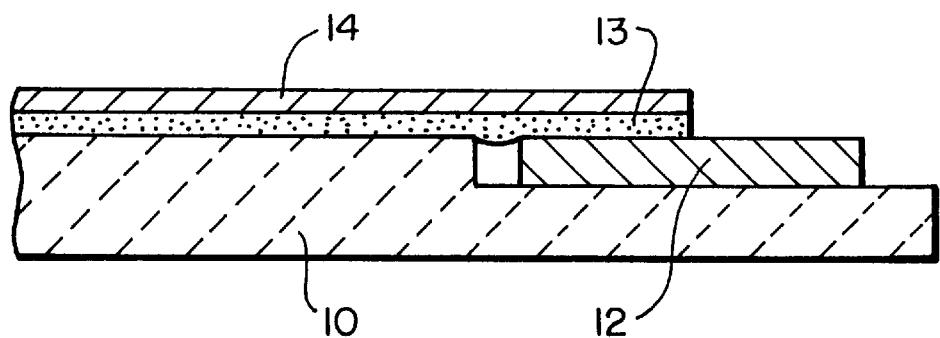
FIG_5

OVER-VOLTAGE PROTECTION SYSTEM FOR INTEGRATED CIRCUITS USING THE BONDING PADS AND PASSIVATION LAYER

BACKGROUND OF THE INVENTION

This invention relates generally to semiconductor integrated circuits and more particularly, it relates to a protection system for integrated circuits to prevent inadvertent damage caused by over-voltage transients such as electrostatic discharge.

It is generally known that the magnitude of an electric voltage allowed to be applied to an integrated circuit package is rather limited since the physical size of the integrated circuit package is fairly small. When the integrated circuit package is not being used, for example, in storage or handling, the external leads or pins thereof are susceptible to the build-up of a static charge thereon. If the integrated circuit package happens to come in contact with a ground potential, the accumulated static charges will flow to ground. Such static discharge can be of a catastrophic nature with sufficient energy to cause damage or even destroy the semiconductor element or chip mounted within the integrated circuit package.

In order to protect the semiconductor chip in the integrated circuit package from being destroyed when such static discharges occur, there has been provided in the prior art a protection element such as a transistor element or a p-n junction applied with a reverse bias, which breaks down when the semiconductor chip encounters an unexpectedly high voltage.

SUMMARY OF THE INVENTION

The present invention provides an improved protection system for integrated circuits which prevents inadvertent damage caused by over-voltage power surges. The protection system uses the bonding pads and passivation type layer of the integrated circuit so as to be relatively simple and economical to manufacture. The present invention comprises extending a passivation type layer of an integrated circuit over the bonding pads and placing a ground plane over that passivation type layer so as to create an over-voltage switching element out of that combination. The passivation type layer can be any of a large variety of materials.

In one aspect of the invention there is provided a surge protection system on an integrated circuit having a surge protection layer coupled to the bonding pads of the integrated circuit and a ground plane coupled to the surge protection layer.

In another aspect of the invention there is provided an integrated circuit protected from inadvertent damage caused by over-voltage transients having a semiconductor body having a central portion with circuit elements therein, a plurality of bonding pads disposed around the central portion and coupled to the circuit elements, an over-voltage transient protection layer over-laying the central portion and a portion of each of the bonding pads, and a ground plane on the over-voltage transient protection layer.

BRIEF DESCRIPTION OF THE DRAWINGS

The objects and advantages of the present invention will become more fully apparent from the following detailed description when read in conjunction with the accompanying drawings with like reference numerals indicating corresponding parts throughout, wherein:

FIG. 1 is a top plan view of a conventional integrated circuit chip;

FIG. 2 is a top plan view of a conventional integrated circuit chip having a protection system constructed in accordance with the principles of the present invention;

FIG. 3 is an enlarged view of a bonding pad of the integrated circuit chip of FIG. 2;

FIG. 4 is an enlarged view of an alternate embodiment for the bonding pads of the integrated circuit chip; and FIG. 5 is an enlarged partial cross-sectional view taken along line 5—5 of FIG. 2.

DETAILED DESCRIPTION OF THE PREFERRED EMBODIMENTS

Referring now in detail to the drawings, there is shown in FIG. 1 a top plan view of a semiconductor integrated circuit chip or die 10. The chip 10 has a generally square or rectangular-shaped semiconductor body of, for example, silicon and a large number of active and passive circuit elements (not shown) formed in its central portion 11. In order to supply signals that are to be processed to the chip and to obtain the processed signals from the chip, the chip 10 is provided with a large number of signal bonding pads 12 which are disposed near the periphery of the chip 10. These signal bonding pads 12 may consist of any combination of input bonding pads, output bonding pads, and input-output (I/O) bonding pads which are electrically coupled to the circuit elements contained in the central portion 11 of the chip 10.

The chip 10 is conventionally mounted within a package (not shown) provided with a plurality of external leads or pins (not shown), such as in a DIP (Dual In-Line Package) type or in a SIP (Single In-Line Package) type, and a hermetically sealing metal lid or a molded plastic package. A flip-chip configuration using solder balls on the bonding pads 12 to connect the chip and protection system to the integrated circuit package is within the scope of the invention.

In order to prevent the chip 10 from being damaged or destroyed by an over-voltage transient such as electrostatic charges accumulated on any one of the plurality of external pins (not shown), the chip 10 of the present invention includes a protection system for interlinking all the bonding pads 12 so that the surge on the external pin having the electrostatic charge will be routed immediately via low resistance pathways to the pin referenced to ground. Since an electrostatic discharge event (i.e., high voltage, low current, short duration) endangers the thin oxide films in the integrated circuit element and a large power dissipation causes heat which damages the junctions formed therein, the protection system has been designed so as to convert the high voltage into a high current pulse which is caused to flow between the charged pin and ground. In practice, this could be between any one of the plurality of external pins and any one of the other remaining pins.

In one embodiment, the protection system of the present invention includes a surge protection layer 13 (as shown in FIGS. 2–5) coupled with (i.e., in electrical communication with) a conductive ground plane 14, such as but not limited to copper or nickel, wherein the surge protection layer 13 overlays the central portion 11 of the chip and a portion of each of the bonding pads 12. The ground plane 14 is preferably, although does not have to be, in contact with the surge protection layer 13. In addition, preferably the ground plane 14 extends substantially over the central portion of the passivation layer as shown but it is within the scope of the present invention that the ground plane forms a ring near or at the periphery of the passivation layer. A ground connection is made between the ground plane 14 and the ground of the system, such as by coupling the ground plane to the ground pad of the integrated circuit. As shown in FIGS. 2, 3 and 5, the surge protection layer 13 and ground plane 14 extend over only a portion of the bonding pads 12 so as to leave a portion for conventional bonding of those pads to a package. Alternatively, as shown in FIG. 4, the bonding pads 12 can be modified slightly (designated 12') to include an extended portion 15. The extended portion 15 is covered by the surge protection layer 13 and ground plane 14 so as to leave the entire bonding pad 12 available for conventional bonding of the pad to an integrated circuit package. As will be apparent from this embodiment, the surge protection layer 13 and ground plane 14 do not have to (although preferably do) overlay the bonding pads but rather just need to be in electrical communication with the bonding pads.

The surge protection layer 13 can be any of a large variety of materials that initially act as an insulator and then switch to conducting when an over-voltage situation (e.g., voltage spike) occurs at one of the bonding pads 12. In this way, the surge protection system shunts the voltage spike off to ground through the surge protection layer 13 to the ground plane 14 then onto the ground pad through the ground connection.

It has been found that a surge protection layer 13 of less than about 1.6 mils will provide effective over-voltage protection and under other circumstances less than about 0.8 mils is effective. It is preferable in many applications that the thickness be less than about 0.5 mils and more preferably less than about 0.2 mils. The surge protection layer 13 of the present invention operating in this manner can be, but not limited to, a polymer, polymer-metal composite, glass, ceramic (e.g., AlN or $Al_2O_3$), polymer-glass composite, polymer-ceramic composite, dielectric, or a non-linear resistance material. The surge protection layer 13 acts as a passivation layer and as such can also be a conventional passivation layer of the integrated circuit chip. Surprisingly, it has been discovered that placing a conventional passivation layer between the ground plane and the bonding pads causes the conventional passivation layer to operate like a non-linear resistance switching material when an over-voltage situation occurs. Examples of passivation layers include chemical vapor deposited or sputtered silicon nitride, silicon dioxide, carbides, RF sputtered ceramic material such as various doped and undoped titanantes, zirconates, niobates, tantalates, stanates, hafnates, and manganates.

Likewise, the surge protection layer can be a non-linear resistance material or any dielectric such as will impede the flow of electrical current from the bonding pads 12 to the ground plane until there is an over-voltage condition. The non-linear resistance characteristics of the surge protection layer are determined by the material used and the volume of the material. See U.S. Pat. No. 4,977,357 issued to Shrier, U.S. Pat. No. 4,928,199 issued to Diaz et al. and U.S. Pat. No. 4,726,991 issued to Hyatt et al. In operation, the non-linear resistance material initially has high electrical resistance. When the circuit experiences an over-voltage spike, the non-linear resistance material quickly changes to a low electrical resistance state in order to short the over-voltage to a ground. After the over-voltage has passed, the material immediately reverts back to a high electrical resistance state. These non-linear resistance materials typically comprise finely divided particles dispersed in an organic resin or insulating medium. For example, U.S. Pat. No. 4,977,357 (Shrier) and U.S. Pat. No. 4,726,991 (Hyatt et al.) disclose such materials.

In another embodiment of the invention which comprises as the surge protection layer a thin layer of a neat dielectric polymer, glass, ceramic or composites thereof, it has been found that the surge protection system is surprisingly effective at a desired range of clamping voltages provided that the layer of neat dielectric polymer, glass, ceramic or composites thereof is sufficiently thin. It has been found that for some polymers a thickness of less than about 0.8 mil will provide effective over-voltage protection under various conditions, while for other polymers a thickness of less than about 1.6 mils provides the desired performance characteristics. It is preferable in many applications that the thickness be less than about 0.5 mil and more preferably less than about 0.2 mil. Similarly, when the surge protection layer is a glass layer it is preferred that the thickness be less than about 0.8 mil, but for some glasses in certain applications a thickness of up to about 1.6 mils is appropriate. As will be appreciated by one skilled in the art, the actual thickness of the neat dielectric polymer, glass, ceramic or composites thereof layer employed in a particular over-voltage protection function will vary depending on the type of polymer or glass used, the operating conditions of the IC chip in which the surge protection layer is employed and the performance properties required of the surge protection layer.

As used in the disclosure and description of the present invention, the term "neat dielectric polymer, glass, ceramic or composites thereof" refers to a polymeric, glass, ceramic or composite thereof material which can act as a dielectric or insulating material under the normal voltage and current conditions of intended use and which is unfilled, i.e., does not contain conductive or semiconductive particles such as those typically used in binders or otherwise associated with non-linear resistance materials of the prior art. However, "neat dielectric polymer, glass, ceramic or composites thereof" is intended to include polymeric, glass, ceramic or composites thereof materials which fulfill the above criteria, but which may contain or have added to them insulative or inert particles or materials that are inactive or do not interfere with the desired dielectric/over-voltage protection properties of the polymer or glass layer as used in the present invention.

The polymers and glasses useful in this aspect of the invention can be selected from polymers known in the art to be useful as binders in conventional non-linear resistance materials to the extent that such polymers are known to have high resistance to tracking and high resistance to arcing. In addition, other polymers and glasses not previously suitable for or used as such binders are also useful in the present invention if they exhibit sufficient dielectric properties, sufficient resistance to tracking and sufficient resistance to arcing under the operating conditions selected for a device according to this invention.

In general, the types of polymers useful in the present invention include silicone rubber and elastomer, natural rubber, organopolysiloxane, polyethylene, polypropylene, polystyrene, poly(methyl methacrylate), polyacrylonitrile, polyacetal, polycarbonate, polyamide, polyester, phenol-formaldehyde resin, epoxy resin, alkyd resin, polyurethane, polyamide, phenoxy resin, polysulfide resin, polyphenylene oxide resin, polyvinyl chloride, fluoropolymer and chlorofluoropolymer. These and other useful polymers can be used by themselves or can include various substituent groups and can be mixtures, blends or copolymers thereof, wherein the final polymer is selected in accordance with the criteria described above. A particularly preferred polymer is a conventional and commercially available General Electric "615" silicone, and it is also particularly preferred to cure this polymer for about 15 minutes at about 200° C. to obtain properties better suited for use in this invention. It has been found that this polymer provides good performance in a thickness of about 0.2 mil. Another form of polymer useful in this invention is woven or nonwoven polymer fibers compressed into a mat of desired thickness. For example, a polymer fiber material useful in the present invention is a layer of nonwoven aramid (aromatic polyamide) fibers, commercially available as "KEVLAR" or "NOMEX" nonwoven fiber mat from E.I. Du Pont de Nemours & Company. The nonwoven aramid fiber mat of about 1.6 mils has been found to provide good performance when compressed to a thickness of 0.8 mils.

The glass materials useful in this invention are likewise glass materials which have been used as binders in nonlinear resistance materials such as sodium silicate. The dielectric glass, such as a sodium silicate is generally useful in this invention in thicknesses similar to those outlined above for the polymer materials. Further, glass fibers can be used to form the dielectric glass in accordance with this invention.

As will be appreciated by one skilled in the art, various dielectric polymers and glasses can be used in this invention following the teachings contained herein with respect to the thickness that must be maintained for the neat dielectric polymer, glass, ceramic or composites thereof to exhibit the desired clamping voltage and other desired properties. Examples of polymers which can be employed in this invention include those disclosed in U.S. Pat. Nos. 4,298,416, 4,483,973, 4,499,234, 4,514,529, 4,523,001, 4,554,338, 4,563,498, 4,580,794, the disclosures of which are incorporated herein by reference. As indicated, other resins may be selected for use in accordance with this invention.

In another aspect of this invention, it has been found that the above described neat dielectric polymer, glass, ceramic or composites thereof layer can be used in combination with a non-linear resistance material to modify and enhance certain properties and performance characteristics of the non-linear resistance. As referred to as part of this invention, the non-linear resistance material can be a conventional variable voltage material which comprises a binder containing conductive particles and/or semiconductive particles and/or insulative particles. As used in this invention, the non-linear resistance material may also include other novel, modified and improved non-linear resistance materials or over-voltage components such as disclosed in this specification.

The non-linear resistance material used in accordance with the present invention can be any non-linear resistance material known in the art, for example those disclosed in either U.S. Pat. No. 4,977,357 (Shrier) or U.S. Pat. No. 4,726,991 (Hyatt et al.), which are incorporated herein by reference. Generally, the non-linear resistance material comprises a binder and closely spaced conductive particles homogeneously distributed in the binder and spaced to provide electrical conduction. In addition, various material such as that disclosed in U.S. Pat. No. 4,103,274 (Burgess et al.) can be used in accordance with the present invention.

As a result of the protection system of the present invention, any over-voltage transient or electrostatic charge is kept away from the central portion 11 of the chip 10 containing the circuit elements by routing the high current from the charged bonding pad directly through the surge protection layer 13 to the ground plane 14 and out the grounded bonding pad, thereby avoiding the circuit elements of the central portion of the chip 10 and preventing inadvertent damage to the chip. The surge protection system of the present invention is designed so as to switch from an insulator to a conductor only when a voltage received at the bonding pads 12 is higher than the normally allowable voltage. Typically, the ordinary semiconductor chip is made to work with a relatively low voltage, i.e., 5 volts. Therefore, the surge protection system comes into play only when the voltage is higher than 5 volts.

From the foregoing detailed description, it can thus be seen that the present invention provides an improved protection system for integrated circuits to prevent inadvertent damage caused by over-voltage transients which includes means for interlinking all of the bonding pads so that the surge on the pad having the over-voltage transient charge will be routed immediately via low resistance pathways to the bonding pad referenced to ground.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A surge protection system on an integrated circuit chip having a central portion in which circuit elements are disposed and having a plurality of bonding pads peripheral to the central portion and in electrical communication with the circuit elements, the surge protection system comprising:

a surge protection layer electrically coupled to the bonding pads of the integrated circuit chip, the surge protection layer being formed on the central portion of the integrated circuit chip; and a ground plane coupled to the surge protection layer, wherein the ground plane and surge protection layer provide a current dissipation path between at least one of the bonding pads and ground in the event of an over-voltage transient encounter.

2. The surge protection system of claim 1 wherein the surge protection layer overlaps a portion of the bonding pads of the integrated circuit.

3. The surge protection system of claim 1 wherein the surge protection layer overlaps an extended portion of the bonding pads of the integrated circuit.

4. The surge protection system of claim 1 wherein the surge protection layer is a passivation layer.

5. The surge protection system of claim 1 wherein the ground plane overlays the surge protection layer.

6. The surge protection system of claim 1 wherein the surge protection layer is a silicone or silicone-based composition.

7. The surge protection system of claim 1 wherein the surge protection layer is a ceramic.

8. The surge protection system of claim 1 wherein the surge protection layer is a non-linear resistance material.

9. The surge protection system of claim 1 wherein the surge protection layer is a neat dielectric polymer, glass, ceramic or composite thereof.

10. An integrated circuit protected from inadvertent damage caused by over-voltage transients comprising:
- a semiconductor body having a central portion with circuit elements therein;
- a plurality of bonding pads disposed around the central portion and coupled to the circuit elements;
- an over-voltage transient protection layer formed on the central portion and on a portion of each of the bonding pads; and
- a ground plane connected to ground and formed on the over-voltage transient protection layer, the ground plane and the over-voltage transient protection layer providing a current dissipation path between at least one of the bonding pads and ground in the event of an over-voltage transient encounter.

11. The integrated circuit of claim 10 wherein the portion of each of the bonding pads overlaid by the over-voltage transient protection layer is an extension of the bonding pad.

12. The integrated circuit of claim 10 wherein the over-voltage transient protection layer is a passivation layer.

13. The integrated circuit of claim 10, wherein the central portion of the semiconductor body includes a passivation layer, the over-voltage transient protection layer being formed on the passivation layer.

14. The surge protection system of claim 1, wherein the central portion of the chip includes a passivation layer, the surge protection layer being formed on said passivation layer.

* * * * *